US012754228B2

(12) United States Patent
Kim et al.

(10) Patent No.: US 12,754,228 B2
(45) Date of Patent: Oct. 6, 2026

(54) SEMICONDUCTOR TEST APPARATUS

(71) Applicant: SAMSUNG ELECTRONICS CO., LTD., Suwon-si (KR)

(72) Inventors: Chunghyun Kim, Suwon-si (KR); Changsuk Oh, Seongnam-si (KR); Kiyoung Jeon, Seongnam-si (KR); Jaewon Yoo, Suwon-si (KR); Myoungsuk Jang, Suwon-si (KR); Kwanghwa Lee, Seongnam-si (KR); Seokjae Hong, Seongnam-si (KR)

(73) Assignees: SAMSUNG ELECTRONICS CO., LTD., Suwon-si (KR); YC Corporation, Seongnam-si (KR)

( * ) Notice: Subject to any disclaimer, the term of this patent is extended or adjusted under 35 U.S.C. 154(b) by 152 days.

(21) Appl. No.: 18/920,172

(22) Filed: Oct. 18, 2024

(65) Prior Publication Data

US 2025/0130268 A1 Apr. 24, 2025

(30) Foreign Application Priority Data

Oct. 19, 2023 (KR) ........................ 10-2023-0140610

(51) Int. Cl.
*G01R 31/26* (2020.01)
*H10P 74/00* (2026.01)

(52) U.S. Cl.
CPC ........ *G01R 31/2601* (2013.01); *H10P 74/273* (2026.01)

(58) Field of Classification Search
CPC ............ G01R 31/2601; G01R 31/2889; G01R 1/07314; G01R 31/2863; G01R 31/2867; G01R 31/2891; H10P 74/273
See application file for complete search history.

(56) References Cited

U.S. PATENT DOCUMENTS

| | | | | |
|---|---|---|---|---|
| 6,809,536 | B2 | 10/2004 | Suzuki | |
| 8,779,792 | B2 | 7/2014 | Kim et al. | |
| 8,890,558 | B2 | 11/2014 | Doi | |
| 10,459,007 | B2 | 10/2019 | Kung et al. | |
| 2008/0196474 | A1 * | 8/2008 | Di Stefano ............. | G01M 1/12 73/1.01 |

(Continued)

FOREIGN PATENT DOCUMENTS

| | | | |
|---|---|---|---|
| JP | 5258395 | B2 | 8/2013 |
| KR | 10-0931525 | B1 | 12/2009 |

(Continued)

*Primary Examiner* — Alvaro E Fortich
(74) *Attorney, Agent, or Firm* — Sughrue Mion, PLLC

(57) ABSTRACT

A semiconductor test apparatus includes a base plate, side supporters provided as three or more on a lower surface of the base plate, an elastic cylinder and a side stopper provided on a lower surface of each of the side supporters, a center stopper provided laterally apart from the side supporters on the lower surface of the base plate, a stopper foot provided at one end of the center stopper, a foot supporter provided at one end of the stopper foot, a top plate disposed under the base plate to contact the elastic cylinder and the side stopper, the top plate including a center hole in a center portion thereof, and a substrate cover provided under the top plate, wherein the center stopper and the side stopper are selectively locked.

20 Claims, 11 Drawing Sheets

(56) References Cited

U.S. PATENT DOCUMENTS

| | | | | |
|---|---|---|---|---|
| 2009/0237100 A1* | 9/2009 | Namiki | G01R 31/2887 | 324/756.03 |
| 2011/0031992 A1* | 2/2011 | Kim | G01R 31/2891 | 324/756.03 |
| 2016/0131700 A1* | 5/2016 | Kang | G01R 31/2891 | 324/750.01 |
| 2019/0064219 A1* | 2/2019 | Rhee | G01R 1/07378 | |

FOREIGN PATENT DOCUMENTS

| | | |
|---|---|---|
| KR | 10-1147573 B1 | 5/2012 |
| KR | 10-1168903 B1 | 8/2012 |
| KR | 10-1805816 B1 | 12/2017 |

* cited by examiner

SEMICONDUCTOR TEST APPARATUS

CROSS-REFERENCE TO RELATED APPLICATION

This application is based on and claims priority to Korean Patent Application No. 10-2023-0140610, filed on Oct. 19, 2023, in the Korean Intellectual Property Office, the disclosure of which is incorporated by reference herein in its entirety.

BACKGROUND

1. Field

The disclosure relates to a semiconductor test apparatus.

2. Description of Related Art

In a process of manufacturing a semiconductor device, determination of whether or not a product is good may performed by a semiconductor test process including testing the electrical characteristics of semiconductor devices formed in a wafer. In an operation of testing a wafer by using a probe card included in a semiconductor test device, the reliability of a semiconductor test process may be reduced due to an unstable electrical contact in an operation of electrically connecting a wafer with the probe card.

SUMMARY

Provided is a semiconductor test apparatus which may enhance the reliability of a semiconductor test process.

The object of the disclosure is not limited to the aforesaid, but other objects not described herein will be clearly understood by those of ordinary skill in the art from the following description.

According to an aspect of the disclosure, a semiconductor test apparatus includes: a base plate; a plurality of side supporters on a lower surface of the base plate; an elastic cylinder and a side stopper on a lower surface of each of the plurality of side supporters; a center stopper laterally spaced apart from the plurality of side supporters on the lower surface of the base plate; a stopper foot at one end of the center stopper; a foot supporter at one end of the stopper foot; a top plate under the base plate and configured to contact the elastic cylinder and the side stopper, wherein the top plate includes a center hole in a center portion thereof; and a substrate cover under the top plate, wherein the center stopper and the side stopper are configured to be selectively locked.

According to an aspect of the disclosure, a semiconductor test apparatus includes: a base plate; a plurality of side supporters on a lower surface of the base plate; an elastic cylinder and a side stopper on a lower surface of each of the plurality of side supporters; a supporting frame including a first supporting frame and a second supporting frame intersecting with each other at the lower surface of the base plate; a center stopper at a position at which the first supporting frame intersects with the second supporting frame, wherein the center stopper is laterally spaced apart from the plurality of side supporters; a top plate under the base plate and connected with the elastic cylinder and the side stopper, wherein the top plate includes a center hole under the center stopper; a substrate cover under the top plate; an upper zero insertion force (ZIF) connector on a lower surface of the top plate; and a lower ZIF connector on an upper surface of the substrate cover and coupled to the upper ZIF connector.

According to an aspect of the disclosure, a semiconductor test apparatus includes: a base plate; a plurality of side supporters on a lower surface of the base plate; an elastic cylinder and a side stopper on a lower surface of each of the plurality of side supporters; a supporting frame including a first supporting frame and a second supporting frame intersecting with each other at the lower surface of the base plate; a center stopper at a position at which the first supporting frame intersects with the second supporting frame, wherein the center stopper is laterally spaced apart from the plurality of side supporters; a top plate under the base plate and connected with the elastic cylinder and the side stopper, wherein the top plate includes a center hole under the center stopper; a substrate cover under the top plate; an upper zero insertion force (ZIF) connector on a lower surface of the top plate; a lower ZIF connector on an upper surface of the substrate cover and coupled to the upper ZIF connector; a plurality of Belleville springs on the lower surface of the top plate and between the upper ZIF connector and the lower ZIF connector; a stopper foot at one end of the center stopper, the stopper foot including a ball and a connector; a foot supporter connected with one surface of the stopper foot; a card information unit at a center of the upper surface of the substrate cover; a pneumatic valve including a first pneumatic valve and a second pneumatic valve; a pneumatic regulator connected with the pneumatic valve through a supply line; a controller electrically connected with the first pneumatic valve, the second pneumatic valve, and the pneumatic regulator, wherein the controller is configured to control opening or closing of each of the first pneumatic valve and the second pneumatic valve; and a pneumatic supply configured to supply pressurized air to the pneumatic valve, wherein the one end of the center stopper is inserted into and connected with the ball, and the connector is configured to surround at least a portion of a surface of the ball, wherein the foot supporter is provided as a unitary structure with a surface of the connector opposite from the ball, wherein the plurality of Belleville springs are fixed to the lower surface of the top plate, a portion of each of the plurality of Belleville springs is configured to contact the lower ZIF connector or the substrate cover, and the plurality of Belleville springs are arranged uniformly around the center hole, wherein the foot supporter includes a supporter groove recessed to an inner portion of the foot supporter in a surface of the foot supporter facing the top plate, and an area of a planar shape of the supporter groove is greater than an area of a planar shape of the card information unit, wherein the first pneumatic valve passes through the pneumatic regulator and is connected with the center stopper through a first supply line, and the second pneumatic valve passes through the pneumatic regulator and is connected with the side stopper through a second supply line, and wherein an area of a planar shape of the center hole is greater than an area of a planar shape of the foot supporter.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
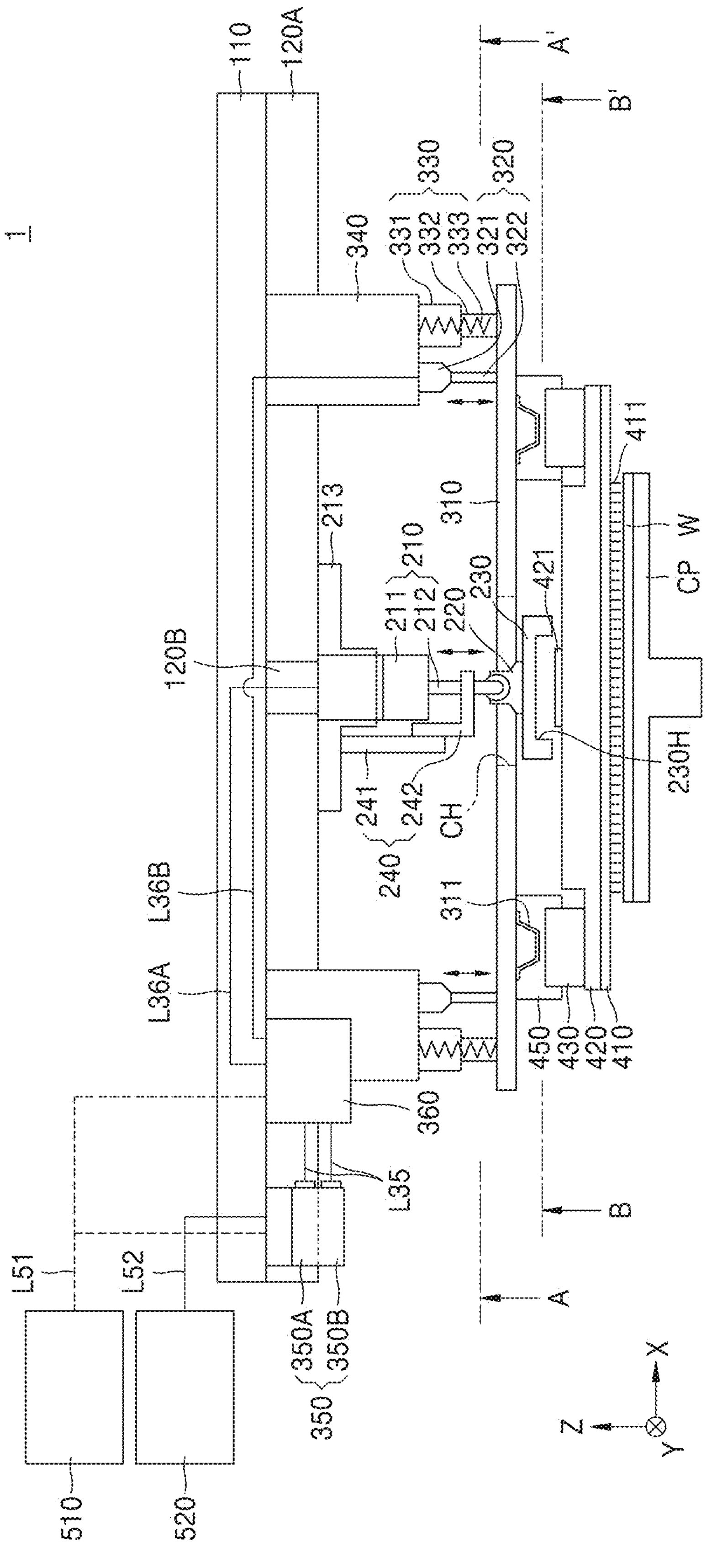
FIG. 1 is a side cross-sectional view illustrating a semiconductor test apparatus according to an embodiment.

Hereinafter, embodiments will be described in detail with reference to the accompanying drawings. Like reference numerals refer to like elements in the drawings, and their repeated descriptions are omitted.

As used herein, a plurality of "units", "modules", "members", and "blocks" may be implemented as a single component or a single "unit", "module", "member", and "block" may include a plurality of components.

It will be understood that when an element is referred to as being "connected" with or to another element, it can be directly or indirectly connected to the other element.

Also, when a part "includes" or "comprises" an element, unless there is a particular description contrary thereto, the part may further include other elements, not excluding the other elements.

Throughout the description, when a member is "on" another member, this includes not only when the member is in contact with the other member, but also when there is another member between the two members.

Herein, the expressions "at least one of a, b or c" and "at least one of a, b and c" indicate "only a," "only b," "only c," "both a and b," "both a and c," "both b and c," and "all of a, b, and c."

It will be understood that, although the terms first, second, third, etc., may be used herein to describe various elements, is the disclosure should not be limited by these terms. These terms are only used to distinguish one element from another element.

As used herein, the singular forms "a," "an" and "the" are intended to include the plural forms as well, unless the context clearly indicates otherwise.

With regard to any method or process described herein, an identification code may be used for the convenience of the description but is not intended to illustrate the order of each step or operation. Each step or operation may be implemented in an order different from the illustrated order unless the context clearly indicates otherwise. One or more steps or operations may be omitted unless the context of the disclosure clearly indicates otherwise.

Figure 2:
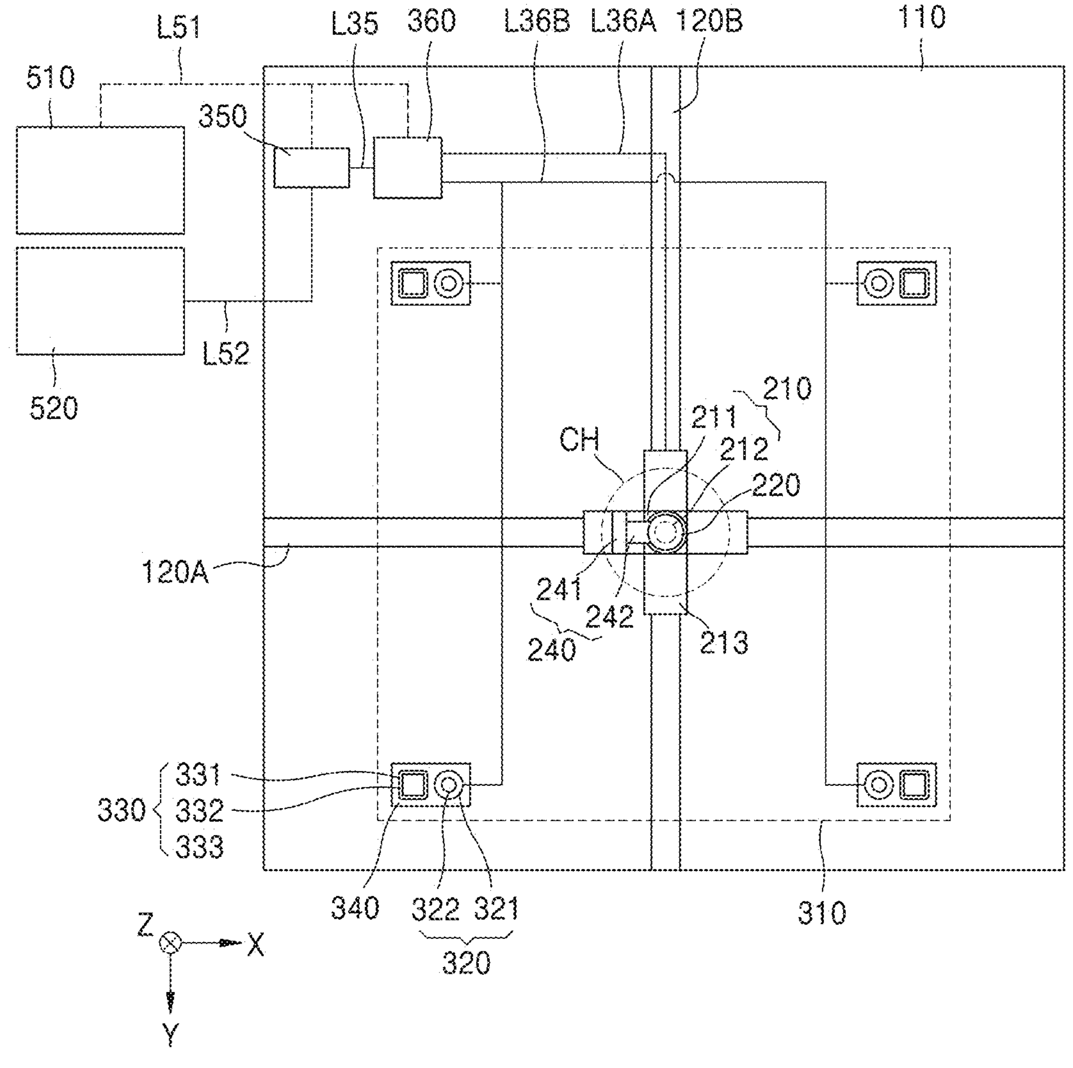
FIG. 2 is a plan view taken along line A-A' of the semiconductor test apparatus of FIG. 1.
Figure 3:
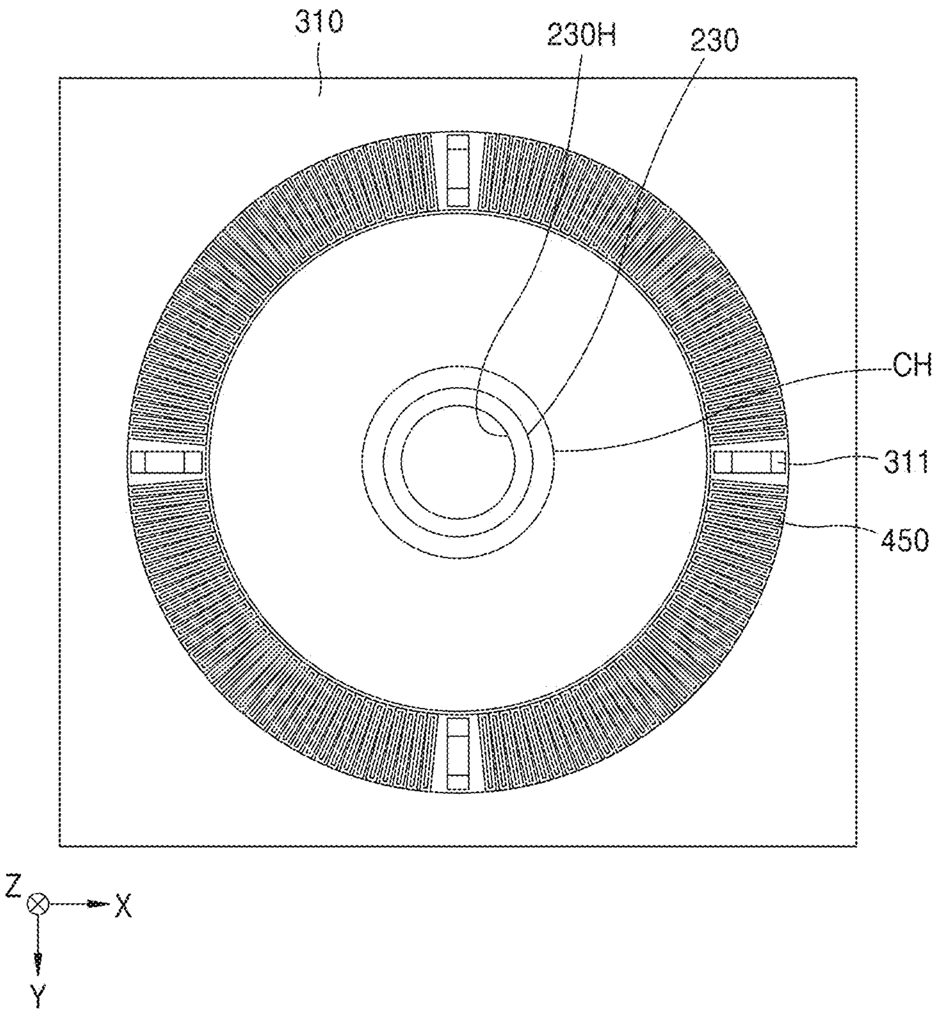
FIG. 3 is a plan view taken along line B-B' of the semiconductor test apparatus of FIG. 1.

FIG. 1 is a side cross-sectional view illustrating a semiconductor test apparatus 1 according to an embodiment. FIG. 2 is a plan view taken along line A-A' of the semiconductor test apparatus 1 according to the embodiment illustrated in FIG. 1. FIG. 3 is a plan view taken along line B-B' of the semiconductor test apparatus 1 according to the embodiment illustrated in FIG. 1.

As used herein, a first direction may denote an X direction, a second direction may denote a Y direction, and the first direction may be perpendicular to the second direction. A third direction may denote a Z direction, and the third direction may be perpendicular to each of the first direction and the second direction. A horizontal surface or a planar surface may denote an X-Y plane. An upper surface of a certain object may denote one surface arranged in a positive third direction with respect to the certain object, and a lower surface of the certain object may denote one surface arranged in a negative third direction with respect to the certain object.

Referring to FIGS. 1 to 3, the semiconductor test apparatus 1 according to an embodiment may include a base plate 110, supporting frames 120A and 120B, a center stopper 210, a stopper foot 220, a foot supporter 230, a top plate 310, a Belleville spring 311, a side stopper 320, an elastic cylinder 330, a side supporter 340, a pneumatic valve 350, a pneumatic regulator 360, zero insertion force (ZIF) connectors 430 and 450, a substrate cover 420, a probe card 410, a controller 510, and a pneumatic supply 520.

As in FIG. 2, a planar shape of the base plate 110 may be a tetragonal shape. The supporting frames (for example, first and second supporting frames) 120A and 120B may be provided on a lower surface of the base plate 110. The first supporting frame 120A may extend in a first direction, and the second supporting frame 120B may extend in a second direction. Each of the first supporting frame 120A and the second supporting frame 120B may be disposed to pass through a center portion of the base plate 110 or a periphery of the center portion. Therefore, a portion at which the first supporting frame 120A intersects with the second supporting frame 120B may be a center portion of the base plate 110 or a periphery of the center portion. To prevent the base plate 110 from being upward sagged or downward sagged, the first supporting frame 120A and the second supporting frame 120B may be provided. The upward sag or downward sag of the base plate 110 may be caused by the weight of a plurality of elements equipped in the base plate 110 and a force based on the center stopper 210 which is described below.

The center stopper 210 and a supporting guide 240 may be disposed at an intersection point at which the first supporting frame 120A intersects with the second supporting frame 120B. The center stopper 210 may be disposed at a point at which the first supporting frame 120A intersects with the second supporting frame 120B or on a lower surface of the base plate 110 vertical on a center portion of the substrate cover 420 which is described below.

The center stopper 210 may include a center body 211 and a first piston 212. One end of the first piston 212 may be inserted into the center body 211, and the stopper foot 220 may be provided at the other end of the first piston 212. The foot supporter 230 connected with the stopper foot 220 may be provided at a portion opposite to a portion at which the first piston 212 is connected with the stopper foot 220.

The center stopper 210 may be disposed under the base plate 110 so that the first piston 212 protrudes downward from the center body 211. The foot supporter 230 may contact a portion of an upper surface of the top plate 310. The foot supporter 230 contacting the top plate 310 may be pushed and raised by a force upward applied by a chuck plate CP which is described below. The first piston 212 connected with the foot supporter 230 may be upward pushed and raised along with the foot supporter 230. As the first piston 212 is pushed and raised, a length of the center stopper 210 may be shortened. In an embodiment, a planar area of the center hole CH may be greater than a planar area of the foot supporter 230.

Pneumatic pressure or hydraulic pressure may be supplied to the center stopper 210. Herein, a case where pneumatic pressure is supplied to the center stopper 210 will be described, but the disclosure is not limited thereto. In the center stopper 210, in a case where a force applied toward the center body 211 is applied to one end of the first piston 212, the first piston 212 may be inserted into the center body 211 in proportion to the magnitude of the applied force. That is, a length of the center stopper 210 may decrease in proportion to the magnitude of the applied force. However, when pneumatic pressure which is greater than the magnitude of a force applied to the center stopper 210 is supplied to the center stopper 210, the first piston 212 may be fixed to the center body 211 in a case where a force, which is greater than a certain magnitude, is not applied to the first piston 212. That is, when pneumatic pressure is sufficiently large despite a force being applied to the center stopper 210, a length of the center stopper 210 may not be reduced.

When a force, which is greater than or equal to a certain magnitude, is not applied to the center stopper 210, a length of the center stopper 210 may not be changed. When a force, which is greater than a force having a certain magnitude, is applied to the center stopper 210, a length of the center stopper 210 may be changed in proportion to the magnitude of the applied force. The force having a certain magnitude may be proportional to the magnitude of pneumatic pressure supplied to the center stopper 210.

To provide an additional description, in a state where air having relatively large pressure is not supplied to the center stopper 210, a length of the center stopper 210 may be reduced in proportion to the magnitude of an external force applied thereto. When air having relatively large pressure is supplied, a length of the center stopper 210 may be fixed despite that a force, which is less than a force, which is greater than a force having a certain magnitude based on the supplied pneumatic pressure, is applied to the center stopper 210.

Herein, a state where a length of the center stopper 210 is not changed by an external force as pneumatic pressure is supplied to the center stopper 210 may be referred to as a lock state of the center stopper 210. That is, in a state where pneumatic pressure is not supplied to the center stopper 210, the center stopper 210 may not be in the lock state, and in a state where relatively large pneumatic pressure is supplied to the center stopper 210, the center stopper 210 may be in the lock state. The center stopper 210 may be an air work supporter, but the disclosure is not limited thereto.

For example, the maximum stroke of the first piston 212 may be about 7 mm (millimeter) to about 9 mm. A supporting force, corresponding to a case where pneumatic pressure of the center stopper 210 is supplied by about 0.5 MPa (Megapascal), may be about 2.5 kN (kilonewtons) to about 3.5 kN. Alternatively, based on first pneumatic pressure P1 supplied to the center stopper 210, a supporting force of the center stopper 210 may be provided as "a supporting force of a center stopper (kN)=9.0×P1−1.5". Herein, a supporting force of the center stopper 210 may denote a load which is capable of being supported by the center stopper 210 when pneumatic pressure is supplied thereto. Like the center stopper 210, a supporting force of the side stopper 320 may denote a load which is capable of being supported by the side stopper 320 when pneumatic pressure is supplied thereto. The specifications of the center stopper 210 may be selected by a user of the semiconductor test apparatus 1 depending on the case.

For example, in a case where the center stopper 210 is not in the lock state (for example, a case where pneumatic pressure is not supplied to the center stopper 210), a length of the center stopper 210 may be reduced when an external force having a range of about 3 N (Newtons) to about 6 N is applied to the center stopper 210. In a case where the center stopper 210 is in the lock state (for example, a case where pneumatic pressure is supplied to the center stopper 210), a length of the center stopper 210 may not be changed even when an external force of about 3 kN or less is applied to the center stopper 210. As another example, in a case where a supporting force of the center stopper 210 is about 3 kN as pneumatic pressure is supplied to the center stopper 210, a length of the center stopper 210 may not be changed even when an external force of about 3 kN or less is applied to the center stopper 210.

The supporting guide 240 may include a guide support 241 and a center guide 242. The center guide 242 may be configured to move in a vertical direction with respect to the guide support 241. The center guide 242 may be connected with the first piston 212 of the center stopper 210. The center guide 242 may guide the vertical movement of the first piston 212 with respect to the center body 211. The first piston 212 may be configured to enable vertical movement, but due to shaking caused by a clearance between elements of the first piston 212, the movement of the first piston 212 in the first direction or the second direction in addition to a third direction which is a vertical direction may occur with respect to the center body 211. The supporting guide 240 may prevent the movement of the first piston 212 in the first direction or the second direction and may guide the vertical movement of the first piston 212, and thus, the supporting guide 240 may aid the vertical movement of the center stopper 210. Therefore, the stability of the center stopper 210 for supporting the substrate cover 420 may be enhanced, and accordingly, the stability of the semiconductor test apparatus 1 according to an embodiment may be enhanced.

In an embodiment, a side shape of the center guide 242 may have an L-shape. The first piston 212 may pass through the center guide 242, and simultaneously, the center guide 242 and the first piston 212 may be fixed to each other. When the first piston 212 moves upward, the center guide 242 may also move upward along with the first piston 212. On the other hand, when the first piston 212 moves downward, the center guide 242 may also move downward along with the first piston 212.

The center stopper 210 may be fixed to the first supporting frame 120A and the second supporting frame 120B through a stopper connector 213. The center body 211 of the center stopper 210 may be connected with and fixed to the first supporting frame 120A and the second supporting frame 120B through the stopper connector 213 on a plane with respect to the center body 211. That is, as in FIG. 2, the stopper connector 213 may be provided in four directions with respect to the center body 211. Alternatively, the stopper connector 213 may be provided in both directions opposite to each other. On the other hand, the center body 211 may be directly connected with the first supporting frame 120A and the second supporting frame 120B, or may be directly fixed to the base plate 110.

The side stopper 320 and the elastic cylinder 330 may be provided on a lower surface of the side supporter 340 to protrude from the side supporter 340 in a negative third direction. The side supporter 340 may be disposed on a lower surface of the base plate 110. The side stopper 320 and the elastic cylinder 330 may contact an upper surface of the top plate 310. The side stopper 320 and the elastic cylinder 330 may support the top plate 310 from a force applied to the top plate 310 at a lower portion thereof.

As used herein, an outer boundary of the top plate 310 may denote a perimeter of a planar shape of the top plate 310, and for example, may denote a boundary illustrated by a tetragonal dashed line as in FIG. 2. Alternatively, the boundary illustrated by the tetragonal dashed line as in FIG. 2 may have a shape where the lower surface of the base plate 110 overlaps a shape of the top plate 310.

As in FIG. 1, the side supporter 340 may be provided on the lower surface of the base plate 110 so that the side stopper 320 and the elastic cylinder 330 do not deviate from the outer boundary of the top plate 310 and, for example, may be disposed not to deviate to the outside of the outer boundary of the top plate 310. As another example, the side stopper 320 and the elastic cylinder 330 may be disposed not to deviate from a shape where the top plate 310 overlaps the lower surface of the base plate 110.

In a case which supports a planar-shaped structure, the supporting of three or more points on the planar-shaped structure may be needed for stable supporting. Accordingly, the side supporter 340, the side stopper 320, and the elastic cylinder 330 may be provided at three or more positions of the lower surface of the base plate 110.

For example, as in FIG. 2. the side supporter 340 may be provided at each of four positions of the lower surface of the base plate 110 such that the base plate 110 does not deviate to the outside of the outer boundary of the top plate 310. When a planar shape of the top plate 310 is a tetragonal shape, four side stopper 320-elastic cylinder 330 pairs may be respectively provided at four side supporters 340. Four side stopper 320-elastic cylinder 330 pairs may be configured to respectively support inner portions of four vertexes of a tetragonal shape of the top plate 310.

The side stopper 320 may include a side body part 321 and a second piston 322. The side body part 321 may be disposed on a lower surface of the side supporter 340 which is in turn disposed on the lower surface of the base plate 110. A portion of the second piston 322 may be provided in the side body part 321. The other portion of the second piston 322 may protrude from the side body part 321.

One end of the second piston 322 may contact an upper surface of the top plate 310. The second piston 322 contacting the top plate 310 may be pushed and raised by a force upward applied by the chuck plate CP which is described below. As the second piston 322 is pushed and raised to the side body part 321, a length of the side stopper 320 may be reduced.

Pneumatic pressure or hydraulic pressure may be supplied to the side stopper 320. Herein, a case where pneumatic pressure is supplied to the side stopper 320 will be described for example, but the disclosure is not limited thereto.

Like the center stopper 210 described above, a length of the side stopper 320 may be reduced in proportion to the magnitude of an external force applied thereto in a state where air having high pressure is not supplied to the side stopper 320. When air having high pressure is supplied, a length of the side stopper 320 may be fixed despite the fact that a force, which is less than a force which is greater than a force having a certain magnitude based on the supplied pneumatic pressure, is applied to the side stopper 320.

As used herein, a state where a length of the side stopper 320 is not changed by an external force as air having high pressure is supplied to the side stopper 320 may be referred to as a lock state of the side stopper 320. That is, in a state where air having high pressure is not supplied to the side stopper 320, the side stopper 320 may not be in the lock state, and in a state where air having high pressure is supplied to the side stopper 320, the side stopper 320 may be in the lock state. The side stopper 320 may be an air work supporter, but is not limited thereto.

For example, the maximum stroke of the second piston 322 may be about 5 mm to about 7 mm. A supporting force, corresponding to a case where pneumatic pressure of the side stopper 320 is supplied by about 0.5 MPa, may be about 0.4 kN to about 0.8 kN. Alternatively, based on second pneumatic pressure P2 supplied to the side stopper 320, a supporting force of the side stopper 320 may be provided as "a supporting force of a side stopper (kN)=2.0×P2−0.4". The spec of the side stopper 320 may be selected by a user of the semiconductor test apparatus 1 depending on the case.

The elastic cylinder 330 may include an upper cylinder 331, a lower cylinder 332, and an internal elastic unit 333. A portion of the lower cylinder 332 may be inserted into the upper cylinder 331, and one exposed end of the lower cylinder 332 may contact an upper surface of the top plate 310. Alternatively, the one exposed end of the lower cylinder 332 may be connected with the upper surface of the top plate 310.

A length of the elastic cylinder 330 may be reduced by a force upward applied by the chuck plate CP which is described below. However, the elastic cylinder 330 may include an internal elastic unit 333, and thus, a length of the elastic cylinder 330 may be reduced in proportion to the magnitude of a force applied by the top plate 310. Unlike the side stopper 320, the lock state may not be applied to the elastic cylinder 330, and a length of the elastic cylinder 330 may be changed in proportion to the magnitude of a force applied to the elastic cylinder 330. For example, an elastic modulus of the elastic cylinder 330 may be about 20 N/mm to about 100 N/mm.

A force upward applied by the chuck plate CP may be transferred to the top plate 310, and the top plate 310 may upward push and raise the side stopper 320 and the elastic cylinder 330. A length of the side stopper 320 and a length of the elastic cylinder 330 may decrease by a length which they are upwardly pushed and raised. Furthermore, the elastic cylinder 330 may apply a repulsive force to the top plate 310 in proportion to a length by which the elastic cylinder 330 is pushed and raised by the top plate 310. The elastic cylinder 330 may apply a repulsive force to the top plate 310 in proportion to a length by which the side stopper 320 is pushed and raised by the top plate 310, but a repulsive force provided by the side stopper 320 in a state where the side stopper 320 is not locked may be far less than a repulsive force provided by the elastic cylinder 330. When pneumatic pressure is supplied to the side stopper 320, the side stopper 320 may be in the lock state, and thus, even when the top plate 310 applies a larger force to the elastic cylinder 330 and the side stopper 320, the top plate 310 may not further push and raise the elastic cylinder 330 and the side stopper 320.

The controller 510 may be connected with each of the pneumatic valve 350 and the pneumatic regulator 360 through a first control line L51 and may control the pneumatic valve 350 and the pneumatic regulator 360. The pneumatic supply 520 may supply high-pressure air to the pneumatic valve 350 through the first supply line L52. The pneumatic supply 520 may transmit or receive a control signal to or from the controller 510. The pneumatic supply 520 may supply high-pressure air.

The pneumatic valve 350 may be disposed on the lower surface of the base plate 110. The pneumatic valve 350 may include a first pneumatic valve 350A and a second pneumatic valve 350B. The first pneumatic valve 350A and the second pneumatic valve 350B may be controlled by the controller 510. Each of the first pneumatic valve 350A and the second pneumatic valve 350B may adjust the supply of high-pressure air supplied to the center stopper 210 and the side stopper 320. When high-pressure air is output from the first pneumatic valve 350A, the center stopper 210 may be in the lock state, and when high-pressure air is not output from the first pneumatic valve 350A, the center stopper 210 may not be in the lock state. Likewise, when high-pressure air is output from the second pneumatic valve 350B, the side stopper 320 may be in the lock state, and when high-pressure air is not output from the second pneumatic valve 350B, the side stopper 320 may not be in the lock state.

The pneumatic regulator 360 may be disposed on the base plate 110. For example, as in FIG. 1, the pneumatic regulator 360 may be provided on the lower surface of the base plate 110. The pneumatic regulator 360 may decrease the pressure of air, supplied to the pneumatic regulator 360 by a certain pressure, and may then continue to provide output air at the decreased pressure.

The pneumatic regulator 360 may be connected with each of the first pneumatic valve 350A and the second pneumatic valve 350B through a second supply line L35. The pneumatic regulator 360 may supply constant air having a certain pressure to the center stopper 210 and the side stopper 320. For example, the pneumatic regulator 360 may supply constant air having a certain pressure to the center stopper 210 and the side stopper 320 through a third supply line L36A connecting the pneumatic regulator 360 with the center stopper 210 and a fourth supply line L36B connecting the pneumatic regulator 360 with the side stopper 320. For example, the certain pressure of air output from the pneumatic regulator 360 may be about 0.5 MPa, but is not limited thereto.

An upper ZIF connector 450 and the Belleville spring 311 may be provided on the lower surface of the top plate 310. The upper ZIF connector 450 may be disposed on the lower surface of the top plate 310 as in FIG. 3. The upper ZIF connector 450 may be disposed on the substrate cover 420 and may be coupled to the lower ZIF connector 430 to correspond to each other. The upper ZIF connector 450 may be coupled to the lower ZIF connector 430 and may thus be configured to transmit or receive an electrical signal for testing the probe card 410 and a wafer W.

For example, a plurality of upper ZIF connectors 450 may be radially disposed on the lower surface of the top plate 310 with respect to a center hole CH, and the Belleville spring 311 may be disposed at a position at which the upper ZIF connector 450 is not disposed, between adjacent upper ZIF connectors 450. Three or more Belleville springs 311 may be disposed with respect to the center hole CH, so as to stably provide elasticity between the upper ZIF connector 450 and the lower ZIF connector 430. The Belleville spring 311 may be fixed to the lower surface of the top plate 310, and a portion of the Belleville spring 311 may contact the lower ZIF connector 430 or the substrate cover 420. Also, a plurality of Belleville springs 311 may be uniformly arranged at an interval of the same angle with respect to the center hole CH.

For example, the upper ZIF connector 450 may not be disposed in the 12 o'clock, 3 o'clock, 6 o'clock, and 9 o'clock directions with respect to the center hole CH, and the Belleville springs 311 may be respectively arranged in the 12 o'clock, 3 o'clock, 6 o'clock, and 9 o'clock directions with respect to the center hole CH. That is, four Belleville springs 311 may be arranged with respect to the center hole CH. Also, the Belleville springs 311 may be uniformly arranged at a 90-degree interval with respect to the center hole CH. Both ends of the Belleville spring 311 may be fixed to the lower surface of the top plate 310, and a center portion of the Belleville spring 311 may protrude in one direction from the both ends thereof and may contact the lower ZIF connector 430 or an upper surface of the substrate cover 420.

Coupling between the upper ZIF connector 450 and the lower ZIF connector 430 may be solid, and a separate element which prevents the substrate cover 420 and the probe card 410, which are lower elements, from being detached from the top plate 310 may not be needed. Alternatively, a separate element which prevents the lower elements from being detached from the top plate 310 may be provided.

As in FIG. 3, the Belleville spring 311 may be disposed at a position at which there is a gap of the upper ZIF connector 450. Like the upper ZIF connector 450, the lower ZIF connector 430 may be disposed on the substrate cover 420 so that there is a gap. That is, the upper ZIF connector 450 may be coupled to the lower ZIF connector 430 to correspond to each other. Based on a force which is applied by the chuck plate CP which upwardly pushes and raises an element from a lower portion, the upper ZIF connector 450 may be adhered to the lower ZIF connector 430.

The Belleville spring 311 disposed on the lower surface of the top plate 310 may provide elasticity between the top plate 310 and the substrate cover 420 so that an excessive force is prevented from being locally applied between the upper ZIF connector 450 and the lower ZIF connector 430, and the top plate 310 and the substrate cover 420 may be arranged in parallel. Accordingly, the reliability of a semiconductor test performed by the semiconductor test apparatus 1 according to an embodiment may be enhanced.

A card information unit 421 may be disposed on the upper surface of the substrate cover 420. The card information unit 421 may include information which identifies the probe card 410. The card information unit 421 may include, for example, radio frequency identification (RFID). However, the card information unit 421 is not limited to RFID.

A supporter groove 230H, which is a groove recessed to an inner portion of the foot supporter 230, may be provided in a lower surface of the foot supporter 230. The foot supporter 230 may contact the upper surface of the substrate cover 420, and the card information unit 421 may include the supporter groove 230H which is provided in a lower surface of the foot supporter 230 not to contact the foot supporter 230. Therefore, when the foot supporter 230 contacts the upper surface of the substrate cover 420, the card information unit 421 may be provided in the supporter groove 230H and may be apart from the foot supporter 230 (as such, it follows that, in an embodiment, an area of a planar shape of the supporter groove 230H may be greater than an area of a planar shape of the card information unit 421).

The probe card 410 may be disposed on the lower surface of the substrate cover 420 and may be electrically connected with the wafer W through a plurality of pins 411 to perform a test of the wafer W.

Figure 4A:
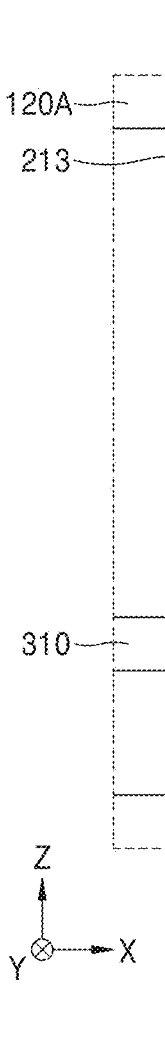
FIG. 4A is an enlarged side view of a center stopper of a semiconductor test apparatus and a periphery thereof, according to an embodiment.
Figure 4B:
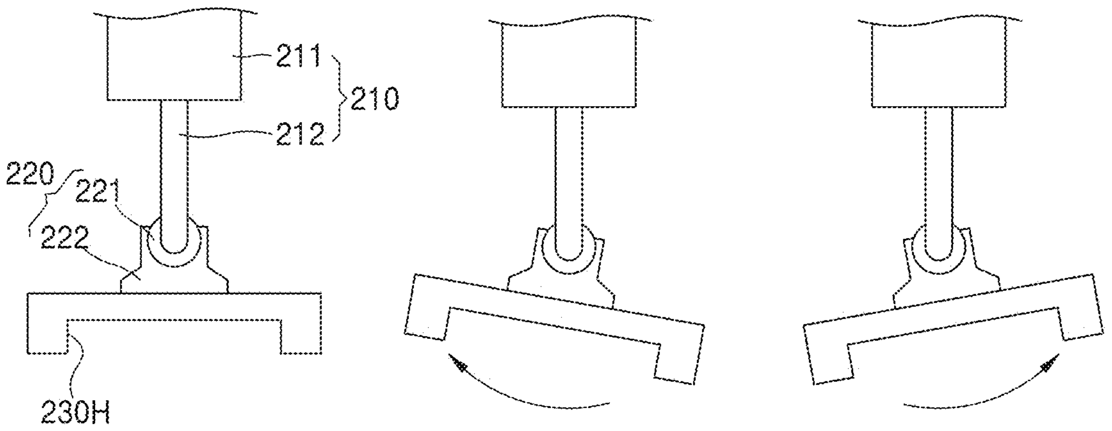
FIG. 4B is a diagram for describing a center stopper, a stopper foot, and a foot supporter each included in a semiconductor test apparatus according to an embodiment.

FIG. 4A is an enlarged side view of the center stopper 210 of the semiconductor test apparatus 1 and a periphery thereof, according to an embodiment. FIG. 4B is a diagram for describing the center stopper 210, the stopper foot 220, and the foot supporter 230 each included in the semiconductor test apparatus 1 according to an embodiment.

Referring to FIGS. 4A and 4B, a ball 221 and a connector 222, which surrounds the ball 221 and is connected with the foot supporter 230, may be provided at an end of the first piston 212 of the center stopper 210. The connector 222 may surround at least a portion of a surface of the ball 221. The connector 222 and the ball 221 each contacting the surface of the ball 221 may slide, and the connector 222 may be rotated and inclined with respect to the ball 221.

For example, as shown in the left portion of FIG. 4B, the foot supporter 230 may be disposed to be horizontal, or as shown in the center portion of FIG. 4B, the foot supporter 230 may be slightly inclined clockwise. Alternatively, as in the right portion of FIG. 4B, the foot supporter 230 may be slightly inclined counterclockwise. In a case where the substrate cover 420 is pushed and raised by the chuck plate CP by being inclined, the foot supporter 230 may contact the substrate cover 420 by being inclined at the same level as the substrate cover 420, and thus, the foot supporter 230 may stably support the substrate cover 420.

Figure 5:
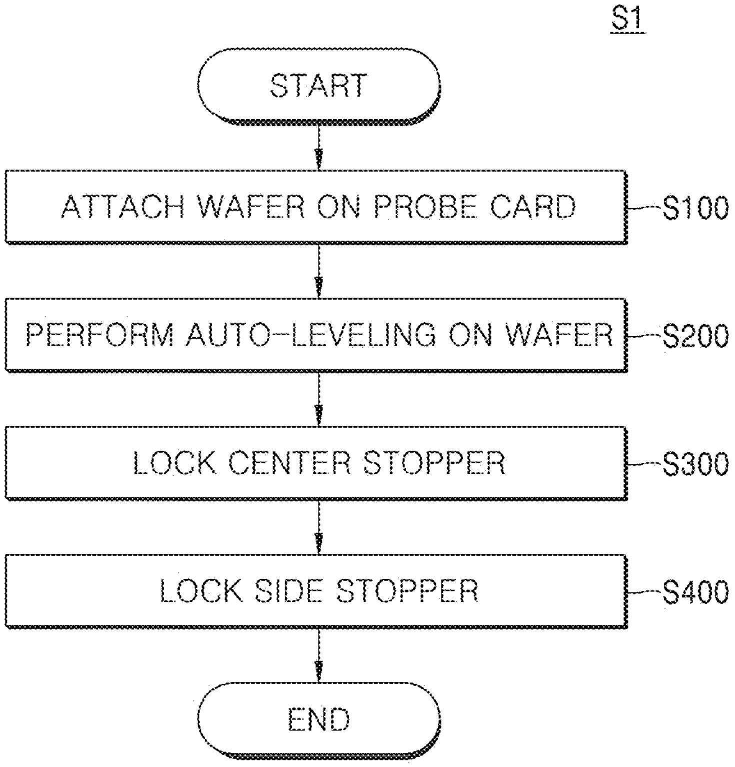
FIG. 5 is a flowchart of a semiconductor test method using a semiconductor test apparatus, according to an embodiment.

FIG. 5 is a flowchart of a semiconductor test method S1 using a semiconductor test apparatus, according to an embodiment. Descriptions which are the same as or similar to the above descriptions may be omitted.

Referring to FIG. 5, the semiconductor test method S1 may include operation S100 of attaching a wafer on a probe card, operation S200 of performing auto-leveling of the wafer, operation S300 of locking a center stopper, and operation S400 of locking a side stopper. The semiconductor test method S1 according to an embodiment will be described below in detail with reference to the drawings.

Figure 6A:
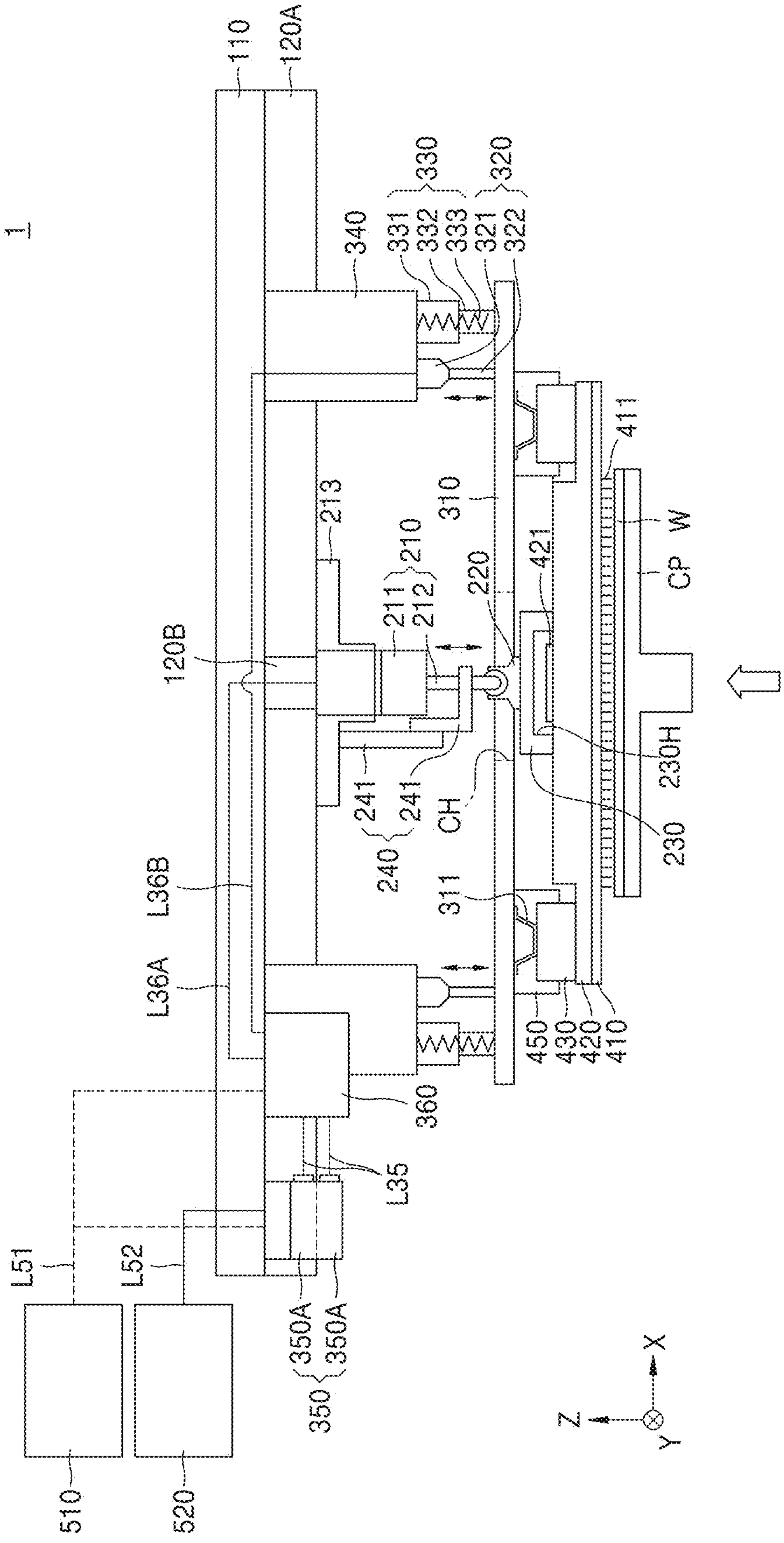
FIGS. 6A, 6B and 6C are diagrams for describing an operation of a semiconductor test apparatus according to an embodiment.
Figure 6B:
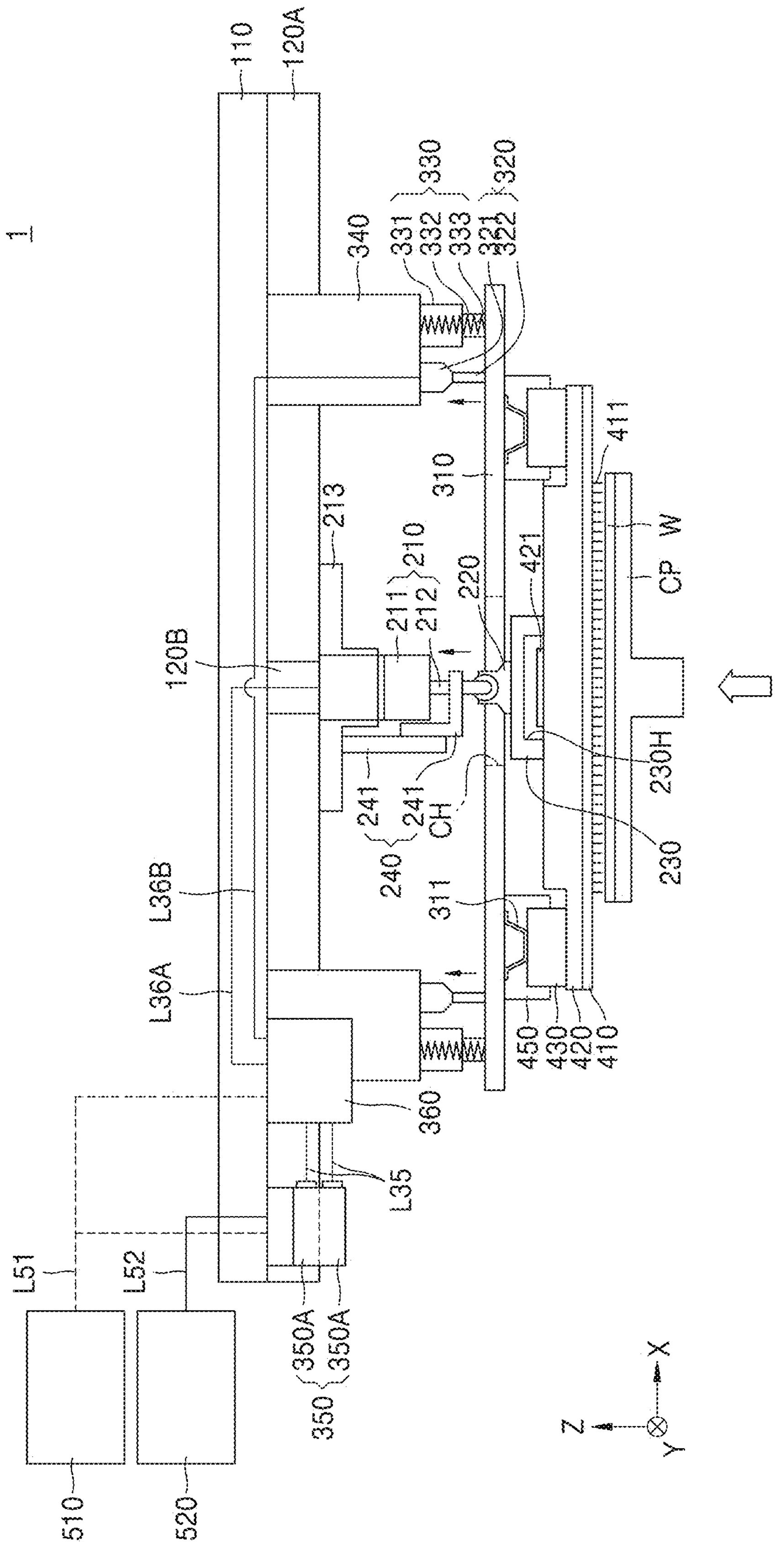
Figure 6C:
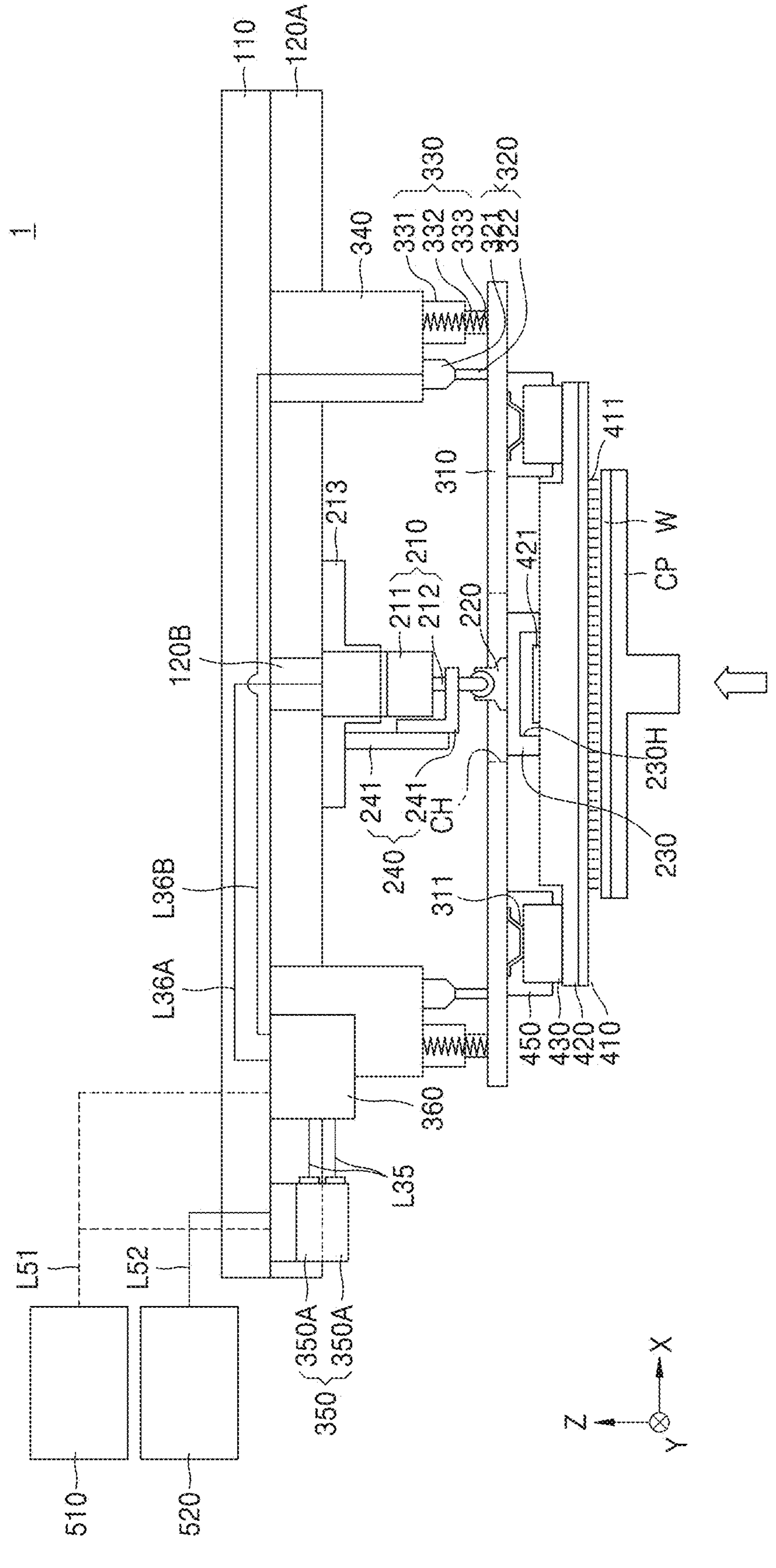

FIGS. 6A to 6C are diagrams for describing an operation of a semiconductor test apparatus 1 according to an embodiment. Descriptions which are the same as or similar to the above descriptions may be omitted. FIGS. 6A to 6C may be described with reference to FIG. 5 illustrating the semiconductor test method S1 using a semiconductor test apparatus, according to an embodiment.

Referring to FIG. 6A, a wafer W may be upward pushed and raised by being placed on an upper surface of a chuck plate CP, and the chuck plate CP may contact a plurality of pins 411 disposed on a lower surface of a probe card 410. That is, this may be an operation of attaching the wafer W to the probe card 410 by using the chuck plate CP. The chuck plate CP may upward apply a force having a sufficient magnitude so that the plurality of pins 411 contact the wafer W. By applying an upward force of the chuck plate CP, an upper ZIF connector 450 may be closer to a lower ZIF connector 430, and then, a portion of the lower ZIF connector 430 may contact a Belleville spring 311. By applying the upward force of the chuck plate CP, a foot supporter 230 may contact an upper surface of a substrate cover 420. As the foot supporter 230 contacts an upper surface of the substrate cover 420, a length of a center stopper 210 may be shortened. However, the center stopper 210 may not be in the lock state.

Referring to FIG. 6B, a probe card 410 and a substrate cover 420 may be upwardly moved by an upward force applied by the chuck plate CP. The top plate 310 supplied with the upward force by a Belleville spring 311 may upwardly apply a force to a side stopper 320 and an elastic cylinder 330. The side stopper 320 and the elastic cylinder 330 may be supplied with a compression force from the top plate 310, and thus, a length of each of the side stopper 320 and the elastic cylinder 330 may be reduced. Simultaneously, the center stopper 210 contacting an upper surface of the substrate cover 420 may be supplied with an upward force from the substrate cover 420, and thus, a length of the center stopper 210 may be shortened.

A force which enables the wafer W to sufficiently contact a plurality of pins 411 of the probe card 410 may be applied by the chuck plate CP, and thus, the center stopper 210 may be in the lock state. When the center stopper 210 is in the lock state, a center portion of each of the substrate cover 420 and the probe card 410 may no longer move. Even when an upward larger force is applied by the chuck plate CP, the center portion of the probe card 410 and the center portion of the substrate cover 420 may not move upward.

Each of the side stopper 320 and the elastic cylinder 330 respectively disposed at sides with respect to the center stopper 210 may be provided as three or more as described above. For example, as in FIG. 2, four side supporters 340 may be provided on a lower surface of a base plate 110, and the side stopper 320 and the elastic cylinder 330 may be disposed on each of the side supporters 340. That is, each of the side stopper 320 and the elastic cylinder 330 may be provided as four.

After the center stopper 210 is in the lock state, all of the side stoppers 320 may be in the lock state. All of the center stopper 210 and the side stopper 320 may be in the lock state, and thus, even when the chuck plate CP applies an upward force to the top plate 310, the top plate 310 may no longer move with respect to the base plate 110. That is, relative positions of the probe card 410 and the wafer W may be fixed.

Referring to FIG. 6C, the Belleville spring 311 contacting a lower ZIF connector 430 may be compressed by an upward force additionally applied by the chuck plate CP. After the center stopper 210 and the side stopper 320 are locked, the Belleville spring 311 may moderate the upward force additionally applied by the chuck plate CP, between the top plate 310 and the substrate cover 420.

Unlike the illustration, the Belleville spring 311 may be compressed before the center stopper 210 and the side stopper 320 are locked, and may thus moderate a force applied between the wafer W and the plurality of pins 411 included in the probe card 410.

Figure 7A:
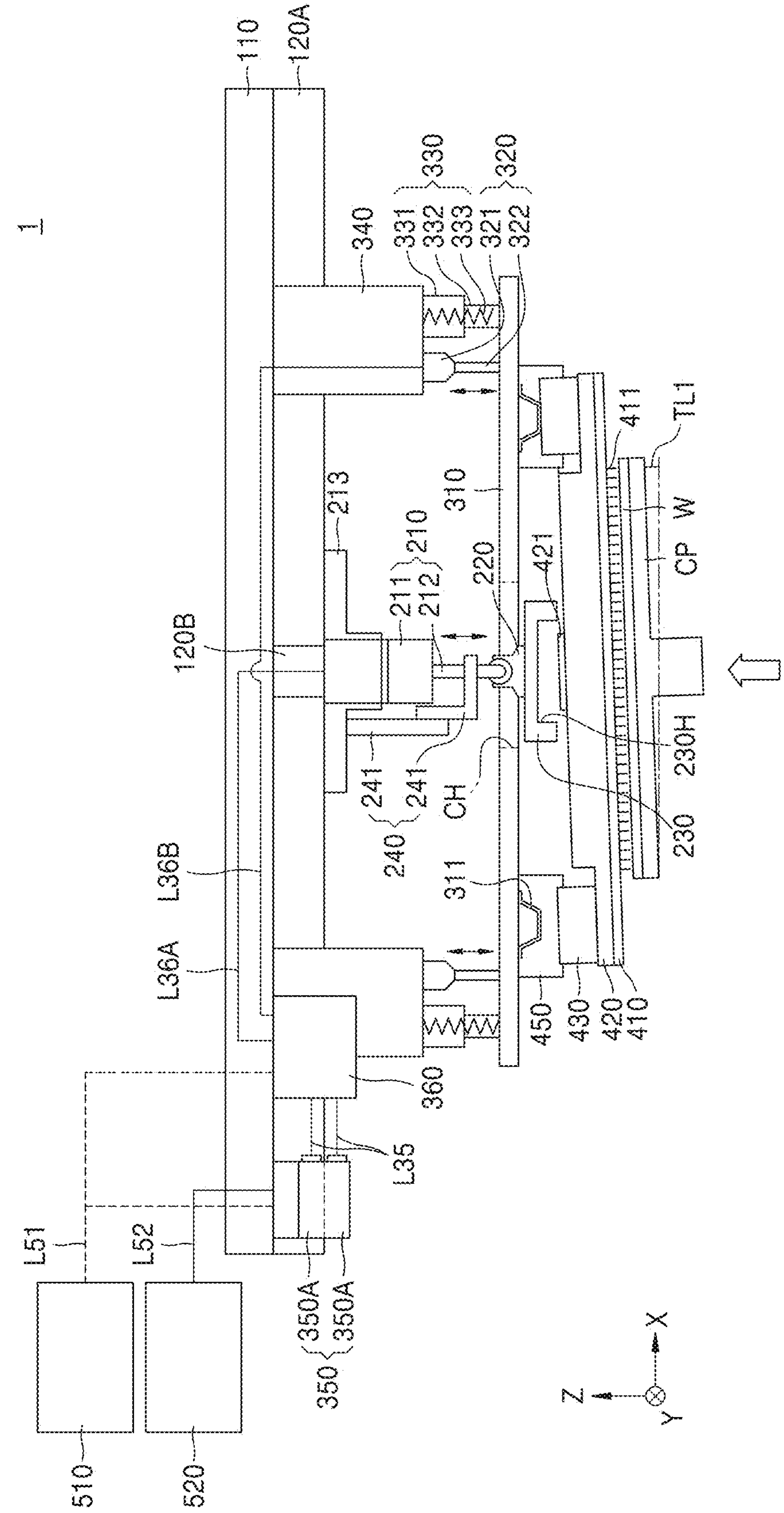
FIGS. 7A and 7B are diagrams for describing an operation of a semiconductor test apparatus according to an embodiment.
Figure 7B:
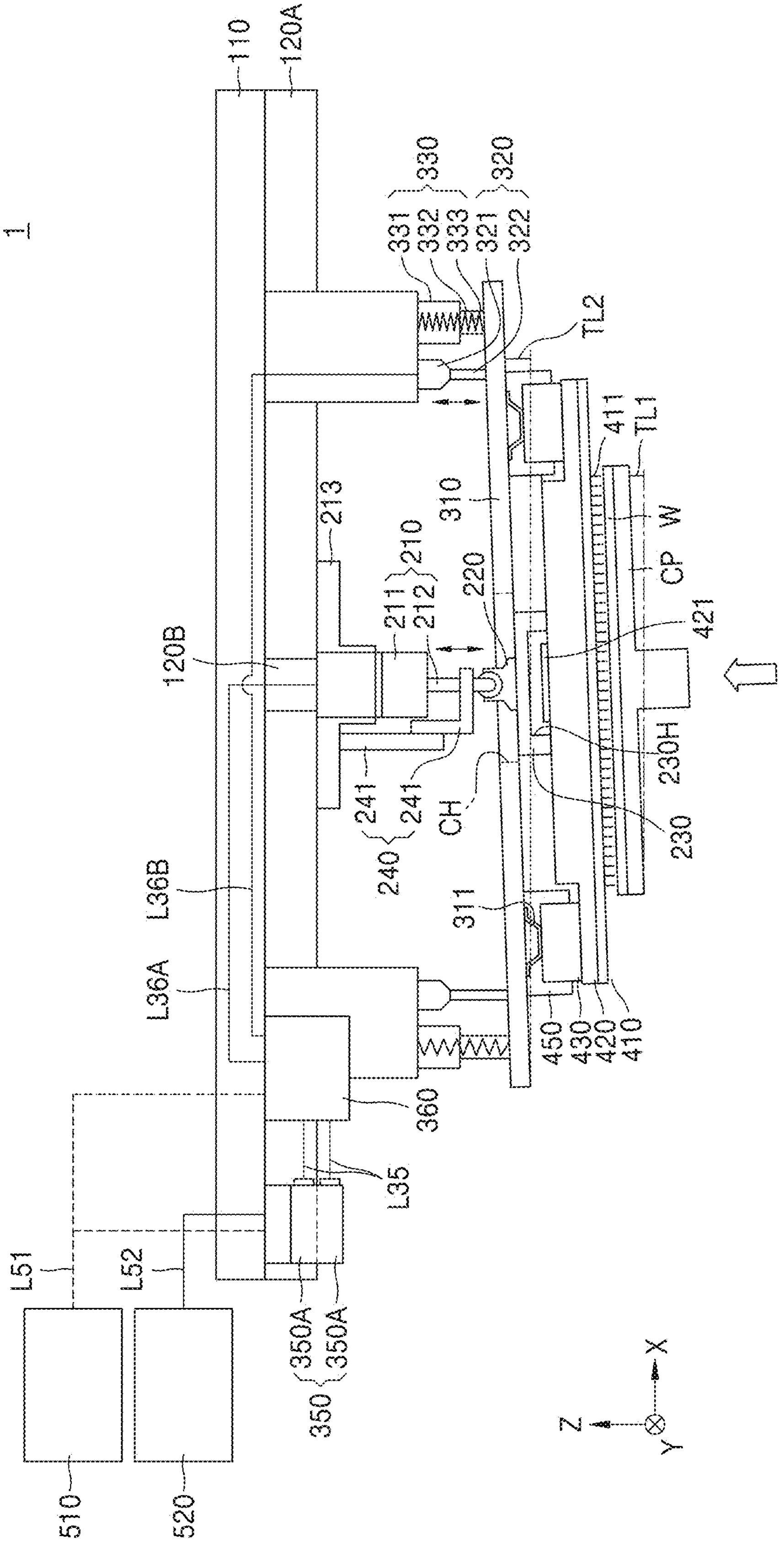

FIGS. 7A and 7B are diagrams for describing an operation of a semiconductor test apparatus 1 according to an embodiment. Descriptions which are the same as or similar to the above descriptions may be omitted. FIGS. 7A and 7B may be described with reference to FIG. 5 illustrating the semiconductor test method S1 using the semiconductor test apparatus, according to an embodiment.

Referring to FIG. 7A, a chuck plate CP may be inclined by a first slope TL1 counterclockwise. A wafer W disposed on the chuck plate CP may be inclined by the first slope TL1. For visibility, a slope may be exaggerated and illustrated compared to a real slope, the first slope TL1 is not necessarily drawn to scale.

To test whether the wafer W is good or not, when all of a plurality of pins 411 contact the chuck plate CP with an appropriate force, an electrical test may be smoothly performed. When a test is performed in a state where the chuck plate CP inclined by the first slope TL1 contacts the plurality of pins 411 of the wafer W which is not inclined, a force applied when the plurality of pins 411 contact the wafer W may be excessive or insufficient, and due to this, an electrical connection between the wafer W and at least some of the plurality of pins 411 may be non-uniform or incomplete.

Referring to FIG. 7B, the chuck plate CP inclined by the first slope TL1 may contact a Belleville spring 311, and thus, the top plate 310 may be inclined like the chuck plate CP.

The top plate 310 may be inclined by a second slope TL2 due to a force transferred from the Belleville spring 311 and a force transferred between an upper ZIF connector 450 and a lower ZIF connector 430. An elastic cylinder 330 contacting an upper surface of the top plate 310 may provide an elastic force, and thus, when the right portion of the top plate 310 is raised more than the left portion of the top plate 310, a force applied from the top plate 310 to an elastic cylinder 330 of the right portion of FIG. 7B may be greater than a force applied from the top plate 310 to an elastic cylinder 330 of the left portion of FIG. 7B, and simultaneously, the elastic cylinder 330 of the right portion of FIG. 7B may apply an elastic force to the top plate 310. Therefore, even when the top plate 310 is pushed and raised in a state where the right portion of FIG. 7B is raised more, the top plate 310 may not excessively be applied to one side, based on a repulsive force caused by an elastic force provided from the elastic cylinder 330.

As described above, an auto-leveling operation may be performed where a slope based on the Belleville spring 311 is reduced, and based on the elastic force of the elastic cylinder 330, a slope of the top plate 310 is adjusted to be approximately equal to that of the wafer W of the chuck plate CP. That is, the semiconductor test apparatus 1 according to an embodiment may be configured so that the top plate 310 is parallel to the wafer W in a state where the first slope TL1 of the wafer W is approximately equal to the second slope TL2 of the top plate 310. Herein, the auto-leveling operation may be performed so that the top plate 310 is parallel to the wafer W in a state where the first slope TL1 of the wafer W is approximately equal to the second slope TL2 of the top plate 310. When the auto-leveling operation is performed, the wafer W may contact the plurality of pins 411 with an appropriate magnitude of force, and thus the wafer W may smoothly contact the plurality of pins 411. Accordingly, the reliability of an electrical test on the wafer W may be enhanced by the semiconductor test apparatus 1 according to an embodiment.

Hereinabove, embodiments have been described in the drawings and the specification. Embodiments have been described by using the terms described herein, but this has been merely used for describing the disclosure and has not been used for limiting a meaning or limiting the scope of the disclosure defined in the following claims. Therefore, it may be understood by those of ordinary skill in the art that various modifications and other equivalent embodiments may be implemented from the disclosure. Accordingly, the spirit and scope of the disclosure may be defined based on the spirit and scope of the following claims.

While the disclosure has been particularly shown and described with reference to embodiments thereof, it will be understood that various changes in form and details may be made therein without departing from the spirit and scope of the following claims.

What is claimed is:

1. A semiconductor test apparatus comprising:

a base plate;

a plurality of side supporters on a lower surface of the base plate;

an elastic cylinder and a side stopper on a lower surface of each of the plurality of side supporters;

a center stopper laterally spaced apart from the plurality of side supporters on the lower surface of the base plate;

a stopper foot at one end of the center stopper;

a foot supporter at one end of the stopper foot;

a top plate under the base plate and configured to contact the elastic cylinder and the side stopper, wherein the top plate comprises a center hole in a center portion thereof; and a substrate cover under the top plate, wherein the center stopper and the side stopper are configured to be selectively locked.

2. The semiconductor test apparatus of claim 1, further comprising a pneumatic valve and a pneumatic regulator, wherein the pneumatic valve is connected to the pneumatic regulator through a second supply line, the pneumatic regulator is connected to the center stopper through a third supply line, and the pneumatic regulator is connected to the side stopper through a fourth supply line.

3. The semiconductor test apparatus of claim 2, further comprising a controller and a pneumatic supply, wherein the controller is connected with each of the pneumatic valve and the pneumatic regulator through a control line, and the pneumatic supply is connected with the pneumatic valve through a first supply line.

4. The semiconductor test apparatus of claim 1, wherein the elastic cylinder and the side stopper are on the top plate at the lower surface of the base plate and are at an inner portion of a shape where the top plate overlaps the lower surface of the base plate, and wherein the elastic cylinder and the side stopper are respectively provided in the plurality of side supporters to protrude vertically in a downward direction.

5. The semiconductor test apparatus of claim 4, wherein the center stopper comprises a center body and a first piston, wherein the stopper foot comprises a ball and a connector, wherein the ball is at one end of the first piston, the connector contacts at least a portion of the ball, and the connector is configured to rotate or to be inclined with respect to the ball, and wherein a lower surface of the connector is connected with the foot supporter at a position opposite to a position of the ball.

6. The semiconductor test apparatus of claim 5, wherein the foot supporter comprises a supporter groove inward recessed in a surface of the foot supporter facing the top plate.

7. The semiconductor test apparatus of claim 5, further comprising a supporting guide on the lower surface of the base plate, wherein the supporting guide comprises a guide support and a center guide, and wherein the center guide is configured to perform a rectilinear motion with respect to the guide support and is connected with the first piston.

8. The semiconductor test apparatus of claim 5, further comprising a plurality of Belleville springs on the lower surface of the top plate, wherein the plurality of Belleville springs are arranged uniformly around the center hole.

9. The semiconductor test apparatus of claim 5, further comprising a supporting frame on one surface of the base plate, wherein the supporting frame comprises a first supporting frame and a second supporting frame, and wherein the first supporting frame is perpendicular to the second supporting frame.

10. The semiconductor test apparatus of claim 9, wherein the center stopper is coupled to the supporting frame and is under the supporting frame.

11. The semiconductor test apparatus of claim 10, further comprising a center stopper connector coupled to each of the supporting frame and the center body, wherein the center stopper connector is configured to fix the center stopper.

12. The semiconductor test apparatus of claim 5, wherein the plurality of side supporters comprises four side supporters, and wherein an elastic modulus of each of the elastic cylinders is in a range of 20 N/mm (Newtons/millimeters) to 60 N/mm.

13. The semiconductor test apparatus of claim 5, wherein a supporting force of the center stopper is in a range of 2,500 N to 3,500 N, and wherein a supporting force of the side stopper is in a range of 400 N to 800 N.

14. A semiconductor test apparatus comprising:

a base plate;

a plurality of side supporters on a lower surface of the base plate;

an elastic cylinder and a side stopper on a lower surface of each of the plurality of side supporters;

a supporting frame comprising a first supporting frame and a second supporting frame intersecting with each other at the lower surface of the base plate;

a center stopper at a position at which the first supporting frame intersects with the second supporting frame, wherein the center stopper is laterally spaced apart from the plurality of side supporters;

a top plate under the base plate and connected with the elastic cylinder and the side stopper, wherein the top plate comprises a center hole under the center stopper;

a substrate cover under the top plate;

an upper zero insertion force (ZIF) connector on a lower surface of the top plate; and a lower ZIF connector on an upper surface of the substrate cover and coupled to the upper ZIF connector.

15. The semiconductor test apparatus of claim 14, further comprising:

a stopper foot at one end of the center stopper; and a foot supporter connected with one surface of the stopper foot, wherein the stopper foot comprises a ball and a connector, wherein the one end of the center stopper is inserted into and connected with the ball, and the connector is configured to surround at least a portion of a surface of the ball, and wherein the foot supporter is connected to the connector on a surface opposite from a position of the ball.

16. The semiconductor test apparatus of claim 15, further comprising a plurality of Belleville springs on the lower surface of the top plate and in a gap included in the upper ZIF connector, wherein each of the plurality of Belleville springs are fixed to the lower surface of the top plate, and a portion of each of the plurality of Belleville springs is configured to contact the lower ZIF connector or the substrate cover, and wherein the plurality of Belleville springs are arranged uniformly around the center hole.

17. The semiconductor test apparatus of claim 16, further comprising a card information unit at a center of the upper surface of the substrate cover, wherein the foot supporter comprises a supporter groove recessed to an inner portion of the foot supporter and provided in a surface of the foot supporter facing the top plate, and wherein an area of a planar shape of the supporter groove is greater than an area of a planar shape of the card information unit.

18. The semiconductor test apparatus of claim 16, further comprising:

a pneumatic valve comprising a first pneumatic valve and a second pneumatic valve; and a pneumatic regulator connected with the pneumatic valve through a supply line, wherein the first pneumatic valve passes through the pneumatic regulator and is connected with the center stopper through a first supply line, and wherein the second pneumatic valve passes through the pneumatic regulator and is connected with the side stopper through a second supply line.

19. The semiconductor test apparatus of claim 18, further comprising a controller and a pneumatic supply, wherein the pneumatic supply is configured to supply pressurized air to the pneumatic valve, and wherein the controller is electrically connected with the first pneumatic valve, the second pneumatic valve, and the pneumatic regulator and is configured to control opening or closing of the first pneumatic valve and the second pneumatic valve.

20. A semiconductor test apparatus comprising:

a base plate;

a plurality of side supporters on a lower surface of the base plate;

an elastic cylinder and a side stopper on a lower surface of each of the plurality of side supporters;

a supporting frame comprising a first supporting frame and a second supporting frame intersecting with each other at the lower surface of the base plate;

a center stopper at a position at which the first supporting frame intersects with the second supporting frame, wherein the center stopper is laterally spaced apart from the plurality of side supporters;

a top plate under the base plate and connected with the elastic cylinder and the side stopper, wherein the top plate comprises a center hole under the center stopper;

a substrate cover under the top plate;

an upper zero insertion force (ZIF) connector on a lower surface of the top plate;

a lower ZIF connector on an upper surface of the substrate cover and coupled to the upper ZIF connector;

a plurality of Belleville springs on the lower surface of the top plate and between the upper ZIF connector and the lower ZIF connector;

a stopper foot at one end of the center stopper, the stopper foot comprising a ball and a connector;

a foot supporter connected with one surface of the stopper foot;

a card information unit at a center of the upper surface of the substrate cover;

a pneumatic valve comprising a first pneumatic valve and a second pneumatic valve;

a pneumatic regulator connected with the pneumatic valve through a supply line;

a controller electrically connected with the first pneumatic valve, the second pneumatic valve, and the pneumatic regulator, wherein the controller is configured to control opening or closing of each of the first pneumatic valve and the second pneumatic valve; and a pneumatic supply configured to supply pressurized air to the pneumatic valve, wherein the one end of the center stopper is inserted into and connected with the ball, and the connector is configured to surround at least a portion of a surface of the ball, wherein the foot supporter is provided as a unitary structure with a surface of the connector opposite from the ball, wherein the plurality of Belleville springs are fixed to the lower surface of the top plate, a portion of each of the plurality of Belleville springs is configured to contact the lower ZIF connector or the substrate cover, and the plurality of Belleville springs are arranged uniformly around the center hole, wherein the foot supporter comprises a supporter groove recessed to an inner portion of the foot supporter in a surface of the foot supporter facing the top plate, and an area of a planar shape of the supporter groove is greater than an area of a planar shape of the card information unit, wherein the first pneumatic valve passes through the pneumatic regulator and is connected with the center stopper through a first supply line, and the second pneumatic valve passes through the pneumatic regulator and is connected with the side stopper through a second supply line, and wherein an area of a planar shape of the center hole is greater than an area of a planar shape of the foot supporter.

* * * * *